United States Patent [19]

Fraas et al.

[11] Patent Number: 4,838,201

[45] Date of Patent: Jun. 13, 1989

[54] APPARATUS AND PROCESS FOR VACUUM CHEMICAL EPITAXY

[75] Inventors: Lewis M. Fraas, El Sobrante; Paul S. McLeod, Berkeley; John A. Cape, San Rafael, all of Calif.

[73] Assignee: Daido Sanso K. K., Osaka, Japan

[21] Appl. No.: 941,005

[22] Filed: Dec. 12, 1986

[51] Int. Cl.[4] .............................................. C23C 16/00
[52] U.S. Cl. ................................... 118/719; 118/715; 118/725
[58] Field of Search ........................ 118/719, 725, 715

[56] References Cited

U.S. PATENT DOCUMENTS

| | | | |
|---|---|---|---|
| 4,171,235 | 10/1979 | Fraas et al. | 148/175 |
| 4,401,054 | 8/1983 | Matsuo | 118/723 |
| 4,404,421 | 9/1983 | Fraas | 136/249 |
| 4,434,742 | 3/1984 | Henaff | 118/723 |
| 4,582,720 | 4/1986 | Yamazaki | 118/723 |

OTHER PUBLICATIONS

L. M. Fraas et al., "Vacuum Chemical Epitaxy Utilizing Organometallic Sources," J. Elec. Materials, vol. 15, No. 3, pp. 175–180, May 1986.
L. D. Partain et al., "Vacuum MOCVD Fabrication of High Efficiency Cells for Multi-Junction Applications", Space Photovoltaic Research & Tech. Conference, Apr. 30–May 2, 1985, pp. 1–9.
Research on Multiband Gap Solar Cells, SERI Semiannual Control Report Mar. 31, 1985 to Aug. 31, 1985 submitted on or about Oct. 16, 1985 for initial approval and mailed to listed recipients on or about Dec. 16, 1985.
Vacuum Chemical Epitaxy by Chevron Research Company, Aug. 1986.
L. M. Fraas et al., "Epitaxial Growth from Organometallic Sources in High Vacuum", J. Vac. Sci. Technol. B4(1) Jan./Feb. 1986.
1985 Electronic Materials Conference Jun. 19–21, 1985 "The Use of Organometallic Sources . . . in a High Vacuum System", Fraas et al.
Research on Multiband GAP Solar Cells–Annual Report Mar. 1, 1984 to Mar. 31, 1985 final report submitted Jul. 15, 1985.
SERI Contract Monthly Report Apr. 1–30, 1985 submitted on or about May 15, 1985. (Applicants' understanding is that monthly reports are not published or available outside of reporting manager of government contract).

Primary Examiner—Richard Bueker
Attorney, Agent, or Firm—Armstrong, Nikaido Marmelstein Kubovcik & Murray

[57] ABSTRACT

A vacuum chemical epitaxy apparatus comprising a first mixing chamber having an inlet for introducing a metal-organic gaseous materials and n-type and p-type dopants, and a plurality of outlets for directing the flow of said metal-organic gases and n-type and p-type dopants toward a substrate; a second mixing chamber disposed below said first chamber having an inlet for introducing a metal-organic gaseous material and n-type and p-type dopants, and a plurality of passages through said first chamber and an outlet for each passage, wherein the passage outlets are in substantially the same plane with the outlets of the first chamber; and means for exhausting the metal-organic gaseous materials and n-type and p-type dopants from the second chamber.

11 Claims, 2 Drawing Sheets

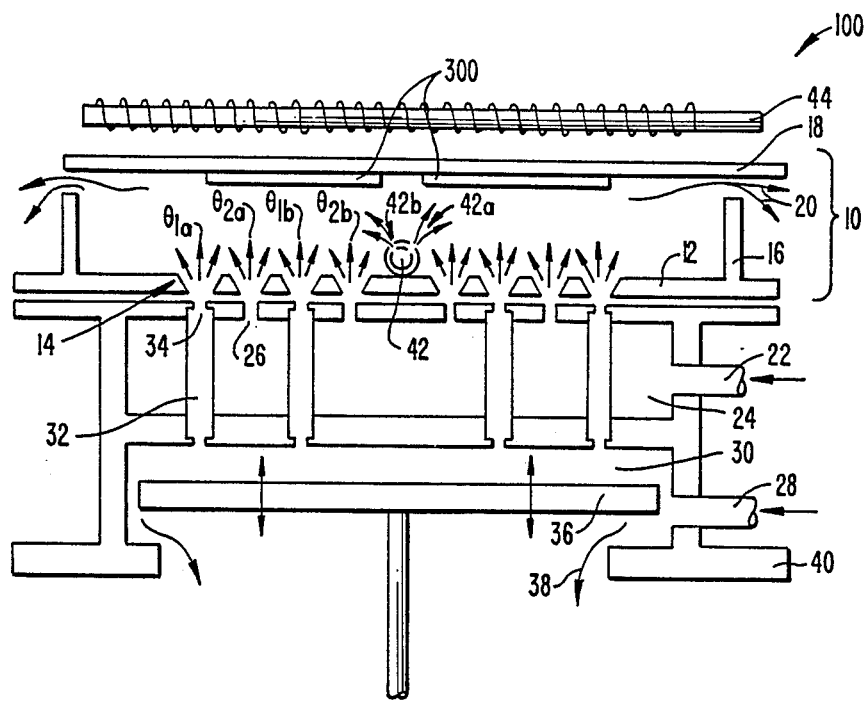
FIG.—1.
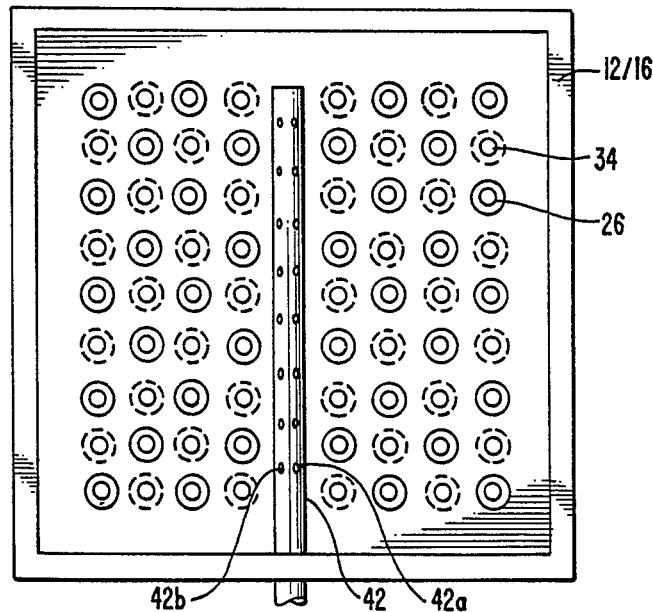
FIG.—2.

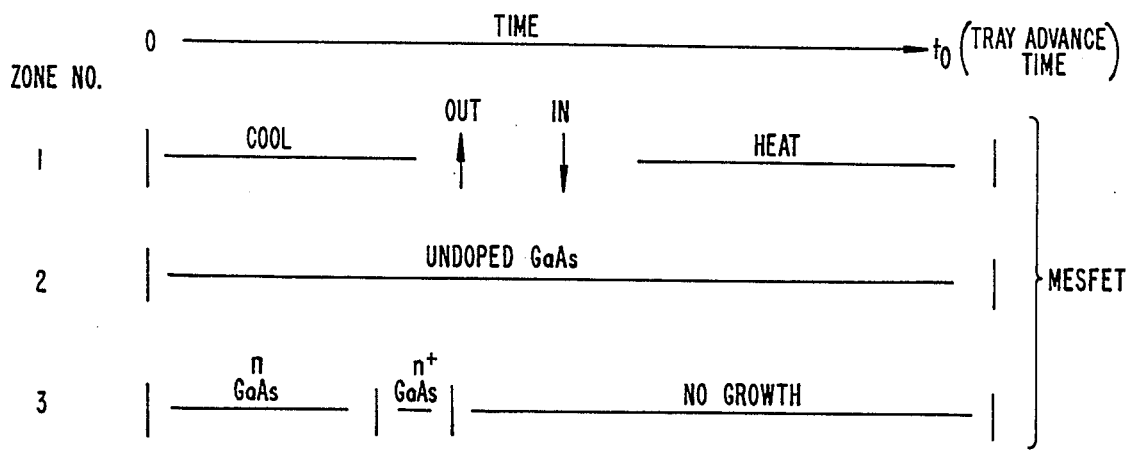
FIG._3.
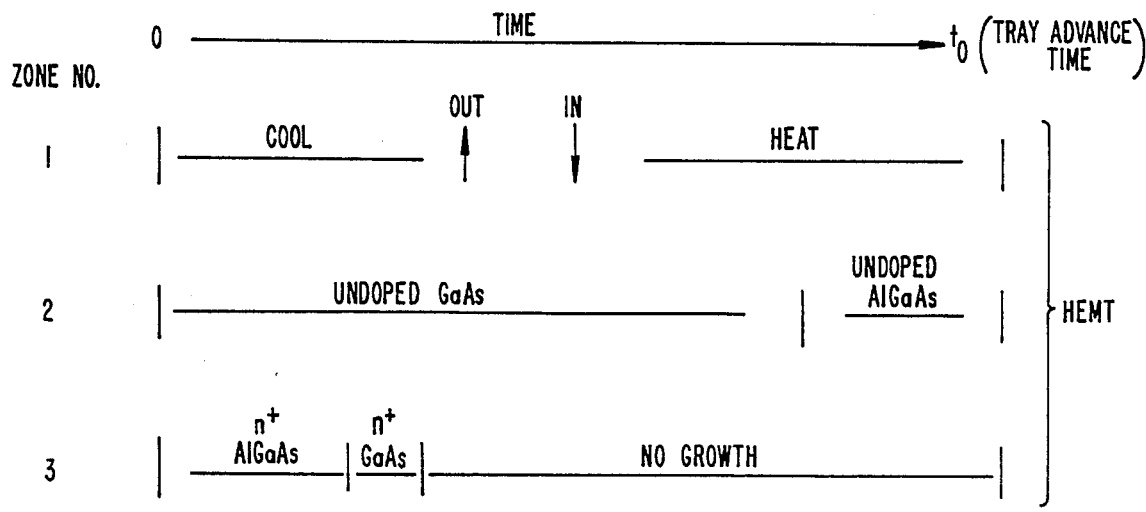
FIG._4.

APPARATUS AND PROCESS FOR VACUUM CHEMICAL EPITAXY

FIELD OF THE INVENTION

This invention relates to the growth of semiconductor layers. More specifically, this invention relates to the growth of Group III-V compound semiconductor layers by vacuum chemical epitaxy. In particular, the invention relates to an improved apparatus and process of growing uniform Group III-V compound semiconductor layers, such as gallium arsenide and aluminum gallium arsenide on large area wafers, i.e., greater than about one inch, through the use of vacuum chemical epitaxial deposition.

BACKGROUND OF THE INVENTION

In recent years, theoretically tantalizing enhancements in performance of Group III-V compound, e.g., GaAs, semiconductor devices over silicon semiconductor devices spurred the development of this area of technology. However, the two main forms of synthesis processes utilized in this field present potential impediments to the rapid commercialization of this technology. Molecular beam epitaxial systems, (MBE), are not easily scalable to meet the needs of the growing Group III-V compound semiconductor device market. The MBE process presents special limitations for the expansion of the concentrator solar cell market because of the large scale quantities needed to effectively compete with conventional solar cells.

Metal organic chemical vapor deposition systems, (MOCVD), have much higher production capacities. However, the MOCVD process suffers from a poor utilization efficiency of the expensive and toxic reactant gases. In addition, large scale utilization of MOCVD systems would present difficult disposal problems for the highly toxic reaction gases now used in the fabrication process. Furthermore, the amount of reaction gases required in the fabrication process renders the technique very expensive except for specialized applications where cost competitiveness with silicon technology is not a major consideration.

We have previously described a technique named vacuum chemical epitaxy (VCE) as vacuum metal-organic-chemical-vapor-deposition at the "Space Photovoltaic Research and Technology Conference" Apr. 30-May 2, 1985. The proceedings were later published in greater detail in a paper titled "Vacuum MOCVD Fabrication of High Efficiency Cells for Multijunction Applications". The VCE technique is scalable and provides for a much higher utilization rate while minimizing the disposal problems of the toxic gases not utilized in the fabrication process. The technique was amplified upon in the Mar. 1, 1984 to Mar. 31, 1985 annual report, forwarded to SERI on July 15, 1985, titled "Research on Multibandgap Solar Cells" for SERI contract ZL-4-03123-1. FIGS. 29 and 31 illustrated a two-nozzle injection system and a multichamber reactor, respectively.

The Apr. 1-30, 1985 informal monthly communication to SERI under contract ZL-4-03123-1 addressed a seven-injection nozzle reactor chamber. More recently, this earlier work was summarized in a paper titled "Epitaxial Growth From Organometallic Sources in High Vacuum", J. Vac. Sci. Technol. B4(l), Jan/Feb. 1986, pp. 22-29. The figures alone in the J. Vac. Technology paper were presented earlier at the Electronic Materials Conference on June 19, 1985.

Additionally, the VCE process utilizing reactive gases to enable the fabrication of devices using carbon as a dopant, is described in U.S. Application Ser. No. 885,898, filed July 14, 1986. The above-mentioned application and articles are completely incorporated herein by reference for all purposes.

In spite of these publications, an improved scale-up reactor and fabrication process have not heretofore been disclosed. Thus, it would also be desirable to have an apparatus and a process which can be extended to the general use of any reactive metal organic gas and dopants in a vacuum environment to optimize the growth of uniform semiconductor layers on large area substrates while minimizing the disposal problems of the toxic reactant gases and the reaction by-products.

SUMMARY OF THE INVENTION

The invention is an improved apparatus and process of fabricating Group III-V compound semiconductor layer(s) on substrates. The process also includes the procedures for optimizing the uniformity of the semiconductor layer(s) grown in a vacuum environment irrespective of the reaction gases selected and specific processes of fabricating MESFET and HEMT semiconductor devices.

BRIEF DESCRIPTION OF THE FIGURES

FIG. 1 illustrates an embodiment of the invention for obtaining uniform semiconductor layers grown from organometallic reactants.

FIG. 2 illustrates a top view of the gas injection portion of the apparatus shown in FIG. 1 for growing Group III-V compound semiconductor layers on a plurality of semiconductor wafers at the same time.

FIG. 3 illustrates a process for fabricating III-V compound MESFET device structure.

FIG. 4 illustrates a process for growing Group III-V compound HEMT device structures.

DETAILED DESCRIPTION OF THE INVENTION

The invention will be more clearly illustrated by referring to the FIGS. 1 and 2 which generally illustrate an apparatus 100 which embodies the broad concepts of our invention.

The apparatus 100 has a reaction chamber 10 defined by a base plate 12, walls 16 and substrate holder and top plate 18. The substrates are illustrated as 300 on top plate 18. The top plate 18 can be fixed or rotatable if a multichamber growth apparatus is required. The chamber 10 includes exhaust ports 20 in the walls 16 adjacent top plate 18. Preferably, the exhaust ports area is about 4% of the deposition area of the chamber. If the chamber is round, then the exhaust ports 20 are really tubular gaps between the edges to the wall 16 and the top plate 18. Generally, as the ratio is increased above 4%, the arsine is less uniformly distributed and the uniformity of the semiconductor layer suffers. As the ratio is decreased below 4%, there is poorer Group III compound utilization. Thus, the ratio can be optimized to achieve a desired balance of factors in order to fabricate particular semiconductor devices. A most preferred embodiment provides for an adjustable exhaust port 20.

The Group III compound gases, such as triethylgallium (TEGa), triethylaluminum, (TEAl) and the like, enter the chamber 10 through injection points, i.e., nozzles 14. The nozzles are in communication with a plurality of mixing chambers for the gas via ports 26 or passageways 32. Depending on the reactivity of the gases, the chambers will be jacketed, not illustrated, and cooled with water or other suitable medium. More particularly, each Group III compound growth composition mixture has a separate chamber.

For example, if growth of semiconductor devices, such as MESFET's or HEMT's were desired, then one chamber 24 would contain a source injection line 22, for example, for the gas TEGa. The chamber 24 permits premixing of gas species such as the analogs trimethyl and triethyl gallium, i.e., TMGa and TEGa, with n-type and/or p-type dopants. The mixing chambers ensure a uniform distribution of Group III compounds and dopants across the surface of the substrate.

The uniformly mixed and distributed gas exits the chamber 24 via port 26 and toward the substrate(s) 300 through the nozzle 14. The number and size of the ports 26 and nozzles 14 associated therewith is a function of the area over which the gas mixture must be distributed at the substrate surface. The geometric arrangement and size of the nozzles to obtain a uniform layer is amplified hereinafter.

If it is desirable or advantageous to rapidly switch on and off different Group III compound materials, e.g., Al, entering the reaction chamber 10, then a second chamber 30 for TEAl with an inlet 28 containing an exhaust valve 36 to exhaust residual Al from the system when Al layers are not being grown is provided. The chamber 30 is in communication with the reaction chamber 10 via the ducts 32 containing the ports 34. The ducts 32 passing through chamber 24 enhance the mixing of the semiconductor gases and dopants, if any. As with the first mixing chamber 24, this second chamber 30 permits mixing different species or analogues of the same Group III compound. The embodiment illustrated in FIG. 1 includes an exhaust poppet valve 36 as a preferred embodiment. However, any other suitable exhaust means sufficient to preclude any residual gas from migrating into chamber 10 is suitable. If a plurality of chambers, i.e., greater than 2, are stacked, then only the last chamber, i.e., the one furthest from the substrate will have a poppet valve while the other chambers will have other suitable exhaust valves. Preferably, the chambers are fabricated in a unitary piece of a suitable non-reactive material such as stainless steel, corrosion resistant alloys and/or composites and the like. If required to prevent any premature reactions of the Group III compounds and/or dopants, the mixing chambers 24 and 30 can be cooled by suitable means known in the art such as water cooling and the like.

Although a one-for-one correspondence of outlets from the chambers 24 and 30 is illustrated, the exact number of outlets can be adjusted to optimize for the volatility of the Group III compound. For example, certain gases may require two outlets from chamber 30 for every outlet from chamber 24 and vice versa.

A top view of injection nozzles 26 and 34 is illustrated in FIG. 2. The nozzle pattern is uniformly distributed to permit the formation of uniform Group III-V compound semiconductor layers on the substrate 300. The configuration and spacing is discussed further below However, spacing between nozzles of about 1 inch with a nozzle size of about ⅛" is suitable for a chamber 10 having a volume of about 36 cubic inches and capable of depositing a semiconductor layer such as a GaAs layer on six 2" wafers wherein the layer thickness uniformity is on the order of ±5%.

The chambers, i.e., reaction chamber 10, and gas mixing chambers 24 and 30 are supported by the base support member 40. Returning to the reaction chamber 10, a source for the Group V compound, preferable in the form of $As_2$, is illustrated as 42. In this embodiment, source 42 is a tubular member having holes 42a and 42b therein. The tube 42 splits nozzles 14 into equal halves to maintain the uniformity of the gas distribution. The Group V compound injection source 42 is located to cause a uniform distribution of the gas.

The Group V compounds diffuse by molecular flow across the substrate plane. Thus, the Group V injection should be spaced to thoroughly mix with the Group III compounds at the surface of the heated substrate. Since gallium arsenide and the analogue derivatives, e.g., gallium arsenide phosphide, and gallium arsenide antiminide, are all combined by adjusting the concentration of the Group V compound, the amount of Group V compound is supplied in the desired ratio of the final product, e.g., gallium arsenide, and whatever the desired combination is for the semiconductor material $GaAs_xP_{1-x}$, $GaAs_ySb_{1-y}$, and the like.

Suitable sources of $As_2$ are thermally cracked $AsH_3$ and alkyl arsines, such as triethylarsine, (TEAs). TEAs is preferred because it is less toxic. These are supplied in excess because the Group III compounds are the rate limitors for the Group III-V reaction. However, the amount required is still about 20 times less than with the MOCVD technique. As the size of the chamber grows, the source 42 can have any uniform configuration. The source 42 should divide the nozzles 14 in a configuration which maintains a uniform number of nozzles 14 of each source of Group III compounds in each partition.

To further enhance the reaction and minimize deposition of unwanted memory causing materials within the reaction chamber 10, the substrates 300 are heated from behind by black body radiation through heaters 44. Thus, the gases which do not touch the heated substrate remain in their gaseous form or are swept out of the system by exhaust opening 20.

More particularly, Group III injection points, having angles of dispersion $\theta_{1a}$, $\theta_{1b}$, $\theta_{2a}$, $\theta_{2b}$ are located within the line of sight of a substrate. Preferably, the injection points, i.e., nozzles 14, and substrate 300 are oriented such that the line of sight of dispersion of the gases from the nozzles is perpendicular to the substrate.

The distance from the nozzles to the substrate is adjusted such that it is less than the mean free path of the gases at the specific vacuum conditions under which the apparatus is operated. This ensures that the apparatus operates in a molecular beam condition. By "mean free path" we mean the distance over which the reactant gas would travel without bumping into other molecules so as to react prior to hitting the heated substrate. Alternatively, a distance from the nozzle to the substrate is selected to optimize the dispersion pattern and the vacuum conditions are adjusted to achieve the necessary molecular flow conditions. The nozzle distance to substrate distance is further correlated with the injection and uniform dispersion of the Group V compounds, e.g., arsine, at the substrate surface.

The nozzle is configured to have an angle of dispersion to, preferably, coincide with an overlap of the placement of the substrate such that the substrate is exposed to the intersecting cross-sectional geometric configuration of the dispersion of the gases. Assuming the nozzle dispersion has a cone-like dispersion pattern with a density of particles decreasing from the center of the cone, then the nozzles and their placement are adjusted so that the algebraic sum of the fluxes (density of particles) from each nozzle remains constant across the surface of the substrate or area of the substrate upon which the uniform Group III-V compound semiconductor layers are to be deposited.

More specifically, the substrate is located at the intersection of the expanding cones of the dispersing gases as opposed to locating the substrate in a non-intersecting portion of the expanding cones which would expose it solely to a single reactive gas dispersion path. The exact uniform configuration of nozzles is a function of the area of deposition, the type of gas employed, the desired rate of growth, and the vacuum conditions. Any geometric pattern with alternating source nozzles for each Group III compound gas is most preferred.

The distance from the nozzles to the substrate is further adjusted such that the concentration of the reactant gases arriving at the heated substrate is high enough to achieve the desired growth rate at a predetermined flow rate. The illustrated apparatus is designed to deposit a layer with a thickness uniformity of ±5% or better and a doping profile uniformity of ±5% or better onto six 2" wafers.

Alternatively, the substrate can remain fixed and the flow rates can be varied to achieve the desired layer growth rate. It should be recognized that the injection of the Group III compound is adjusted to optimize utilization of these materials while minimizing the scattering. Thus, the area of intersecting circles of Group III compounds on the substrates, or other geometric configuration depending upon the nozzle shape, should be adjusted to optimize overlap and achievement of a uniform algebraic sum of all the fluxes from the nozzles aimed at a given substrate and also maximize materials utilization.

As with most growth procedures, there is a trade-off between uniformity and growth rate. Thus, the substrate is heated to a sufficient temperature to promote immediate reaction of the line of sight Group III compounds while not being so close as to permit non-uniform growth rates. In addition, the orifices are distributed so as to provide the most uniform semiconductor layer and doping profile to within ±5% or better and most preferably, better than ±1%.

Generally, the higher the temperature of the substrate, the more quickly the reaction proceeds. However, this is usually at the expense of layer grow rate because of material re-evaporation. Therefore, the temperature is generally adjusted to within the range of about 400°-800° C. and preferably, 500°-700° C. And most preferably, about 600° C. to about 650° C. Suitable vacuum conditions are less than $10^{-5}$ Torr and preferably $10^{-6}$ to $10^{-8}$ Torr.

More specifically, the apparatus is optimized for a particular device structure according to the following ratios and/or equations exemplified for a GaAs layer fabricated from TEGa and $As_2$ derived from thermally cracked $AsH_3$.

$$\frac{f_{As2}}{f_{Ga}} = \frac{\Delta F}{2F_{Ga}} \times \frac{A}{a}$$

This ratio equation states that the $As_2$-to-Ga beam flux ratio is amplified over the $AsH_3$-to-TEGa flow ratio by the ratio of the deposition area to the exit orifice area.

The lower case "f's" are beam fluxes of the subscripted material and the upper case "F's" are flow rates. "A" is the deposition area and "a" is the exhaust area. Preferably, this ratio is about 4%.

$$\lambda = kTV_b/\pi d_a^2 V_h P.$$

In this equation, $d_a$ is the average molecular diameter of the colliding molecules, $\lambda$ is the mean-free path, T is temperature, and the velocities of the "hot" and "beam" molecules are represented by $V_h$ and $V_b$, respectively. Calculating mean-free path for a given reaction chamber configuration enables the apparatus to be run under molecular flow conditions, i.e., MBE conditions, as desired. In other words, the height of the chamber, i.e., nozzle to substrate distance, must be smaller than the mean-free path, $\lambda$, of the Group III alkyl compounds but large enough to obtain a uniform distribution of Group V compounds at the substrate surface.

Finally, the change in pressure from side to side in the chamber must be small when compared to the pressure drop across the exit orifice. For a chamber that is as wide as it is long, the ratio of the conductance across the chamber $C_a$ to the conductance out $C_o$ is given by $$C_a/C_o = 4h^2/a$$

where "h" is the nozzle to substrate distance and "a" is the exit orifice area. Preferably, the Ca/Co ratio is 4. In other words, the pressure variation across the chamber is about 25% or less. Furthermore, the Group V compound, e.g., $As_2$, is supplied in sufficient excess to render this pressure variation insignificant.

A further embodiment of our growth process includes mounting of the substrate on a rotatable holder, such that it can be rotated through intersection of the circles at a rapid rate to provide alternating uniform layers of different semiconductor materials and/or conductivities. An additional benefit would be the fixed location of the substrate at the intersection of the dispersion patterns such that a uniform material is formed with the subsequent movement of the substrate to a different chamber which can be optimized for that specific layer growth without relation to the interactions of the other semiconductor metal organic gases being introduced into a given reaction chamber.

Having described the apparatus, the following procedure permits the fabrication of 960 wafers per week in a three-zone six-wafer per zone VCE apparatus to run two shifts per day. The process incorporates both valve switching, i.e., turning on and off reactant gases and position switching, i.e., moving the substrate through different reaction zones. More specifically, FIG. 3 shows a process sequence chart for MESFET epi-layer growth. Referring to these figures, a wafer tray would be loaded into the first zone and heated for about 15 minutes to 650° C. at $10^{-7}$ Torr, then rotated to the second zone where the undoped GaAs layer about $10^4$ Å thick would be deposited at a growth rate of about 2 microns per hour. The concentration of dopant impurities to the undoped layer should be $1 \times 10^{15}$ atoms/cm$^3$ or less. Next, this tray would move to the third position where the n-type active layer would be deposited. The n-type layer is about 2000 Å thick with an n-type dopant concentration of about $2 \times 10^{17}$ atoms/cm$^3$. The growth rate of the n-type layer is about 2 microns per hour. The tray is then rotated back into the first zone, cooled, and unloaded Finally, source, drain and gate electrodes are applied by means known in the art. In this deposition process the second zone is a growth chamber dedicated exclusively to undoped material, and the third zone is a growth chamber dedicated exclusively to doped material. Note also that at any given time, three trays are being processed simultaneously.

The throughput of such a reactor can be estimated as follows. From experience, we expect that the cooling and heating times in the first (load-unload) zone will be about 15 minutes each. Thus, the tray advance time, $t_0$, will be 30 minutes. Optimally, the 1-micron thick undoped layer will be grown at 2 microns/hour in 30 minutes in Zone 2; and the n-type and n+-type GaAs layers will be grown in Zone 3 in approximately 15 minutes with a 15-minute no-growth period (gallium off). Since the tray advance time is one-half hour, six wafers will come out every one-half hour. In continuous operation, one reactor will then produce 960 wafers per week running two shifts per day.

Having described a proposed MESFET production reactor, we now note that the addition of a controllable Al source in Zones 2 and 3 will allow the production of HEMT's. A process sequence for the production of HEMT's is shown in FIG. 4. The key to this process is the valve design. A viable valve concept is shown and described schematically in FIG. 1.

The heating and cooling times are substantially similar, i.e., about 15 minutes. The n-type layer is $10^4$Å with an impurity concentration of about $1 \times 10^{15}$ atoms/cm$^3$. Thereafter, an undoped Al$_z$Ga$_{1-z}$As layer having a thickness of about 30 to 100Å is grown followed by 500Å n+-type Al$_z$Ga$_{1-z}$As wherein Z is from 0.1 to 0.9 and preferably 0.2 to 0.3. The dopant concentration is about $1 \times 10^{18}$ atoms/cm$^3$ Thereafter, about 1000Å layer of n+-type GaAs, having an n-type dopant of also about $1 \times 10^{18}$ atoms/cm$^2$, is grown by terminating the flow of Al and exhausting the Al source chamber to avoid memory problems Finally, after cooling, source, gate and drain electrodes are formed by methods known in the art.

Having described the general apparatus and process, those modifications obvious to the ordinary skilled artisan from a reading of the embodiments of the invention described herein are intended to be included within the scope of the invention.

What is claimed is:

1. A gas injection block for a vacuum chemical epitaxy apparatus comprising:
   a first mixing chamber;
   said first chamber having an inlet, said inlet suitable for passing metal-organic gaseous materials and n-type and p-type dopants into said chamber;
   a plurality of outlets from said first chamber, said outlets suitable for directing the flow of said metal-organic gases and n-type and p-type dopants toward a substrate;
   a second mixing chamber disposed below said first chamber, said second chamber having an inlet suitable for passing a metal-organic gaseous material and n-type and p-type dopants into said second chamber, said second chamber having a plurality of passages through said first chamber and an outlet for each passage, said outlets from said passages are in substantially the same plane with the outlets of said first chamber; and
   means for exhausting said metal-organic gaseous materials and said n-type and p-type dopants from said second chamber.

2. The apparatus according to claim 1 wherein said means for exhausting said metal-organic gaseous material and said dopants is a poppet valve disposed within said second chamber.

3. The apparatus according to claim 2 wherein said poppet valve is disposed within said second chamber opposite to said passages.

4. The apparatus according to claim 3 further comprising a source for gaseous materials of a different periodic Group than the periodic Group of metal-organic gaseous materials associated with said mixing chambers, said source dividing the outlets from said first and second mixing chambers into uniform groupings of outlets.

5. The apparatus according to claim 4 further comprising means for cooling at least one of the mixing chambers.

6. The apparatus according to claim 5 wherein said first and second chambers form a unitary piece.

7. The apparatus according to claim 1 comprising a plurality of additional chambers disposed sequentially below said second chamber, said chambers having gaseous passages through each previous chamber in order to have outlets in substantially the same plane as the outlets in the first chamber.

8. The apparatus according to claim 9 wherein each of said plurality of chambers have an exhaust valve.

9. The apparatus according to claim 8 further comprising a source for gaseous materials of a different periodic Group than the periodic Group of metal-organic gaseous materials associated with said mixing chambers, said source dividing the outlets from said first and second mixing chambers into uniform groupings of outlets.

10. An apparatus for fabricating Group III-V semiconductor layers, comprising:
   a vacuum chamber;
   a plurality of geometrically arranged Group III compound nozzles, said nozzles are located in substantially the same plane and capable of emitting a Group III gas in a direction of flow which is substantially perpendicular to a substrate located in a substrate plane spaced therefrom;
   a plurality of stacked mixing chambers connected to said nozzles, said chambers providing a mixing chamber for a particular Group III compound and at least one dopant, said plurality of mixing chambers comprising a first mixing chamber, said first chamber having an inlet, said inlet suitable for passing metal-organic gaseous materials and n-type and p-type dopants into said chamber, a plurality of outlets from said first chamber, said outlets suitable for directing the flow of said metal-organic gases and n-type and p-type dopants toward the substrate, a second mixing chamber disposed below said first chamber, said second chamber having an inlet suitable for passing a metal-organic gaseous material and n-type and p-type dopants into said second chamber, said second chamber having a plurality of passages through said first chamber and an outlet for each passage, said outlets from said passages being in substantially the same plane with the outlets of said first chamber; and means for exhausting said metal-organic gaseous materials and said n-type and p-type dopants from said second chamber;

a substrate holder within said chamber, said holder oriented substantially perpendicular to the flow from said nozzles and at a distance from said plane of said nozzles so that the substrate plane is located at a distance less than the mean-free path of the Group III compound at the vacuum condition of the apparatus during the operation but large enough to obtain a uniform distribution of Group V compound at the substrate plane;

a substrate heater, said substrate heater oriented to heat the side of the substrate opposite to the side facing the Group III compound;

a source of Group V compound centrally located with respect to said Group III compound nozzle and dividing said group III nozzles into substantially uniform numbered groups of nozzles, said source of Group V compound being positioned to introduce a flow which is perpendicular to the flow of said Groups III compound, and into the flow of said Group III compound;

means for exhausting non-reacted Group III and Group V compounds adjacent the edges of the chamber defined by the substrate plane;

means for cooling the Group III compound mixing chamber and/or injection nozzles;

means for thermally cracking the Group V compound prior to injection into the area between the substrate and the injection of the Group III compound;

a zone to preheat the substrate prior to exposure to the Group III and V compounds; and a plurality of group III-V deposition zones, said zones capable of depositing a plurality of Group III-V compound compositional semiconductor layers.

11. The apparatus according to claim 10 wherein the exhaust area is about 4% of the deposition area and the pressure variation across the deposition chamber is about 25% or less.

* * * * *

UNITED STATES PATENT AND TRADEMARK OFFICE
CERTIFICATE OF CORRECTION

PATENT NO. : 4,838,201
DATED : June 13, 1989
INVENTOR(S) : FRAAS et al

It is certified that error appears in the above-identified patent and that said Letters Patent is hereby corrected as shown below:

Column 3, line 64, "below" should read --below.--.

Column 7, line 1, "unloaded" should read --unloaded.--;

line 34 "n+-type" should read --$n^+$-type--;

line 36, "atoms/$cm^3$" should read --atoms/$cm^3$.--;

line 38, "atoms/$cm^2$" should read --atoms/$cm^3$--;

line 40, "problems" should read --problems.--.

Column 8, line 43, "nozzles are located in" should read --nozzles being in--.

Column 9, line 17, "nozzle" should read --nozzles--.

Signed and Sealed this

Twenty-second Day of May, 1990

Attest:

HARRY F. MANBECK, JR.

Attesting Officer      Commissioner of Patents and Trademarks